United States Patent
Ikeda

(10) Patent No.: US 6,671,858 B2
(45) Date of Patent: Dec. 30, 2003

(54) METHOD OF DESIGNING HIERARCHICAL LAYOUT OF SEMICONDUCTOR INTEGRATED CIRCUIT, AND COMPUTER PRODUCT

(75) Inventor: Nobuyuki Ikeda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 77 days.

(21) Appl. No.: 10/003,237

(22) Filed: Dec. 6, 2001

(65) Prior Publication Data

US 2003/0014719 A1 Jan. 16, 2003

(30) Foreign Application Priority Data

Jul. 10, 2001 (JP) ........................................ 2001-209851

(51) Int. Cl.[7] .............................................. G06F 17/50
(52) U.S. Cl. ............................................... 716/1; 716/8
(58) Field of Search ........................................ 716/1–14

(56) References Cited

U.S. PATENT DOCUMENTS 4,910,680 A * 3/1990 Hiwatashi ..................... 716/14
5,159,689 A * 10/1992 Shiraishi ...................... 712/208

FOREIGN PATENT DOCUMENTS

JP 3-142857 6/1991

* cited by examiner

*Primary Examiner*—Matthew Smith
*Assistant Examiner*—Sun James Lin
(74) *Attorney, Agent, or Firm*—Leydig, Voit & Mayer, Ltd.

(57) ABSTRACT

In designing an integrated circuit, low-order blocks are arranged in a formation area of a high-order block in a core area with small spacing. Arrangement of and wiring between cells are performed in the low-order blocks. Input/output terminals used for connection between the cells also serve as signal connection terminals of the low-order blocks. Connection between the low-order blocks is performed by connecting the input/output terminals to each other with signal connection wiring. The signal connection wiring is constituted by a wiring layer and a via through a high-order block. The wiring layer and via constituting the signal connection wiring are different from the wiring layer and via used for connection between cells in low-order blocks.

4 Claims, 5 Drawing Sheets

1 : SEMICONDUCTOR INTEGRATED-CIRCUIT DEVICE
11 : CORE AREA
12 : BUFFER AREA
21 : HIGH-ORDER HIERARCHICAL FUNCTIONAL BLOCK
31~34 : LOW-ORDER HIERARCHICAL FUNCTIONAL BLOCK
41a : INTER-LOW-ORDER-HIERARCHICAL-FUNCTIONAL-BLOCK SIGNAL CONNECTION TERMINAL (INPUT/OUTPUT TERMINAL OF CELL)
51 : LOW-ORDER-HIERARCHICAL-FUNCTIONAL-BLOCK SIGNAL CONNECTION WIRING
41 : CELL OF LOW-ORDER HIERARCHICAL FUNCTIONAL BLOCK

FIG.1

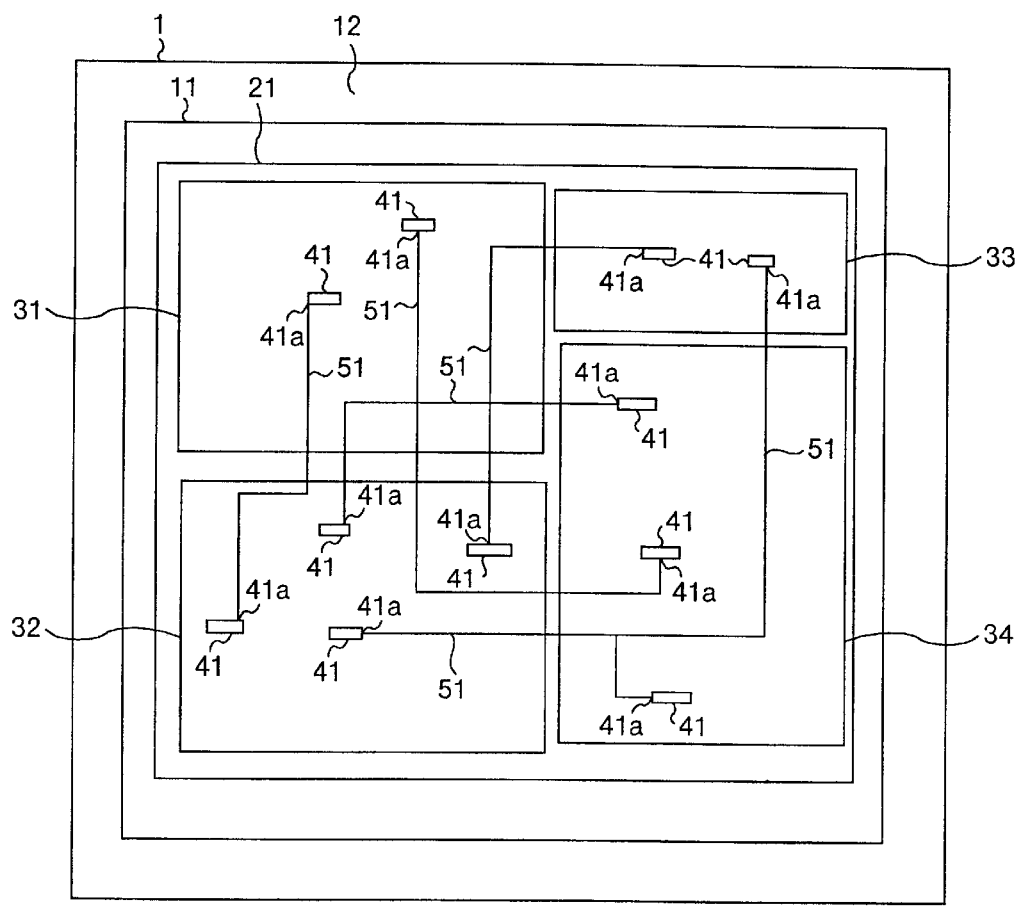

1 : SEMICONDUCTOR INTEGRATED-CIRCUIT DEVICE
11 : CORE AREA
12 : BUFFER AREA
21 : HIGH-ORDER HIERARCHICAL FUNCTIONAL BLOCK
31~34 : LOW-ORDER HIERARCHICAL FUNCTIONAL BLOCK
41a : INTER-LOW-ORDER-HIERARCHICAL-FUNCTIONAL-BLOCK SIGNAL CONNECTION TERMINAL (INPUT/OUTPUT TERMINAL OF CELL)
51 : LOW-ORDER-HIERARCHICAL-FUNCTIONAL-BLOCK SIGNAL CONNECTION WIRING
41 : CELL OF LOW-ORDER HIERARCHICAL FUNCTIONAL BLOCK

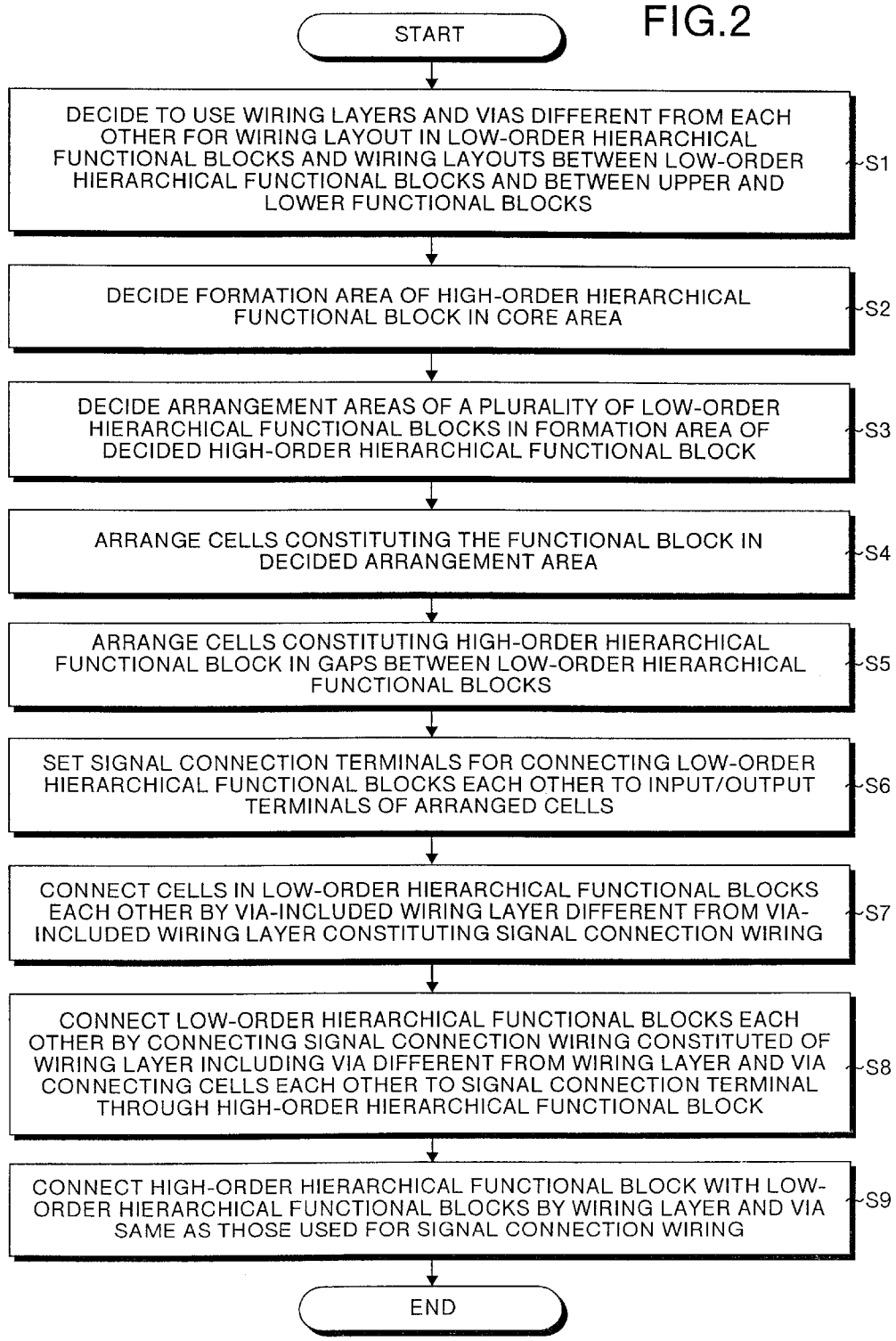

61 : CORE AREA
71~74 : LOW-ORDER FUNCTIONAL BLOCK (HIERARCHICAL LAYOUT AREA)
81 : CELL OF LOW-ORDER HIERARCHICAL FUNCTIONAL BLOCK
91 : CELL OF HIGH-ORDER HIERARCHICAL FUNCTIONAL BLOCK

100 : SEMICONDUCTOR INTEGRATED-CIRCUIT DEVICE
110 : CORE AREA
120 : BUFFER AREA
111 : HIGH-ORDER HIERARCHICAL FUNCTIONAL BLOCK
112~115 : LOW-ORDER HIERARCHICAL FUNCTIONAL BLOCK
117 : INTER-LOW-ORDER-HIERARCHICAL-FUNCTIONAL-BLOCK
SIGNAL CONNECTION TERMINAL (INPUT/OUTPUT TERMINAL OF CELL)
118 : INTER-LOW-ORDER-HIERARCHICAL-FUNCTIONAL-BLOCK
SIGNAL CONNECTION WIRING
116 : INTER-BLOCK WIRING AREA

METHOD OF DESIGNING HIERARCHICAL LAYOUT OF SEMICONDUCTOR INTEGRATED CIRCUIT, AND COMPUTER PRODUCT

FIELD OF THE INVENTION

The present invention relates to a technology for laying out the arrangement of and wiring between a high-order hierarchical functional block on one hand and a plurality of low-order hierarchical functional blocks constituting the high-order hierarchical functional block on the other.

BACKGROUND OF THE INVENTION

In case of a semiconductor integrated-circuit device designed in accordance with a cell base, desired functions have been realized so far as follows. Cells which are already-designed basic circuits including logic circuits such as the AND circuits, OR circuits, flip-flops, or memories are arranged in a predetermined area in a chip and wiring signal connections between each of these logic circuits. Because of recent improvement of the semiconductor fabrication art, it has become possible to mount more functions on one chip whereby the number of gates mounted on one chip has increased drastically. Consequently, the significance of a layout process for arrangement of and wiring between cells has risen.

A hierarchical-layout technique has been frequently used in deciding a layout of a large-scale semiconductor integrated-circuit device. In the hierarchical-layout technique, layout is performed for each one of a plurality of functional blocks, and layout of the semiconductor integrated-circuit device is performed by considering the layouts of the functional blocks.

FIG. 5 concretely explains how a hierarchical-layout design is obtained using the conventional hierarchical-layout technique. As shown in FIG. 5, a semiconductor integrated-circuit device 100 is provided with a core area 110 in which a group of integrated circuits is located, and a buffer area 120 in which a group of peripheral circuits is located.

A high-order hierarchical functional block 111 is located in the core area 110 and a plurality of low-order hierarchical functional blocks 112, 113, 114, and 115 are arranged in the formation area of the high-order hierarchical functional block 111 at both sides of an inter-block wiring area 116.

Signal connection terminals 117 are provided for the circumference of each of the low-order hierarchical functional blocks 112 to 115 and connected by signal connection wirings 118 laid in the inter-block wiring area 116.

In case of conventional hierarchical-layout design, the signal connection terminals 117 for the low-order hierarchical functional blocks 112 to 115 are decided as a high-order hierarchical-layout design and then, the low-order hierarchical functional blocks 112 to 115 are arranged in the core area 110 having a predetermined size by securing the inter-block wiring area 116 necessary and sufficient to connect the blocks 112 to 115 each other. Moreover, internal wiring of each of the low-order hierarchical functional blocks 112 to 115 is executed. Subsequently, the signal connection terminals 117 are connected to each other by signal connection wirings 118 as a high-order hierarchical-layout design.

In the case of conventional hierarchical-layout design, however, signal connection terminals of low-order hierarchical functional blocks are decided for high-order hierarchical-layout design and then cell arrangement and wiring of the low-order hierarchical functional blocks are performed. Therefore, positions of the signal connection terminals restrict the layout of cell arrangement and wiring and moreover influence the high-order hierarchical-layout design. As a result, a problem occurs that layout design requires lots of time and labor.

Moreover, an inter-block wiring area is necessary in a core area in order to connect low-order hierarchical functional blocks to each other for high-order hierarchical-layout design. Therefore, a problem also occurs that the integration degree of a semiconductor integrated-circuit device is lowered.

SUMMARY OF THE INVENTION

It is an object of this invention to provide a method of designing a wiring layout of low-order hierarchical functional blocks without setting an inter-block wiring area between the low-order hierarchical functional blocks and thereby designing high-order hierarchical-layout design. It is another object of this invention to provide a computer program that contains instructions which when executed on a computer realizes the method according to the present invention on the computer.

The method of designing a hierarchical-layout of a semiconductor integrated-circuit device according to one aspect of this invention comprises the steps of: deciding an arrangement area where a high-order hierarchical functional block is to be arranged in a core area, the core area being an area in which a group of integrated circuits is formed; deciding arrangement areas where a plurality of low-order hierarchical functional blocks are to be arranged in the arrangement area of the high-order hierarchical functional block in such a manner that the distance between the low-order hierarchical functional blocks is narrow; arranging cells constituting the low-order hierarchical functional blocks in each of the low-order hierarchical functional blocks; setting signal connection terminals for connecting input/output terminals of the arranged cells to the corresponding low-order functional block; connecting the cells constituting the low-order hierarchical function blocks each other by a first wiring layer including a first via in each of the arrangement areas of the low-order hierarchical functional blocks; connecting the low-order hierarchical functional blocks each other by connecting a second wiring layer including a second via different from the first wiring layer including the first via to input/output terminals of the cells to which the signal connection terminals are set via the high-order hierarchical functional block; and connecting the high-order hierarchical functional block with the low-order hierarchical functional blocks by the second wiring layer including the second via which connects the low-order hierarchical functional blocks each other.

According to the above aspect of the present invention, the formation area of a high-order hierarchical functional block is decided in a core area in which a group of integrated circuits is formed and arrangement areas of a plurality of low-order hierarchical functional blocks are decided in the decided formation area of the high-order hierarchical functional block by decreasing intervals between the low-order hierarchical functional blocks. Then, cells constituting the low-order hierarchical functional blocks are arranged in the arrangement areas of the low-order hierarchical functional blocks. In this case, signal connection terminals for connecting low-order hierarchical functional blocks to each other are set to input/output terminals of the arranged cells. That is, the signal connection terminals of the low-order hierarchical functional blocks are set not to the circumference of the low-order hierarchical functional blocks but to low-order hierarchical functional block areas. Then, the cells constituting the low-order hierarchical functional blocks are connected to each other by a first wiring layer including a first via in the arrangement areas of the low-order hierarchical functional blocks. Moreover, the low-order hierarchical functional blocks are connected to each other by a second wiring layer including a second via through the high-order hierarchical functional block and the high-order hierarchical functional block is connected with the low-order hierarchical functional blocks by the second wiring layer including the second via.

The method of designing a hierarchical-layout of a semiconductor integrated-circuit device according to another aspect of this invention comprises the steps of: reconstituting a net list of a semiconductor integrated circuit device to be fabricated into a high-order hierarchical functional block and a plurality of low-order hierarchical functional blocks; deciding hierarchical-layout areas of the reconstituted low-order hierarchical functional blocks with no gap in the whole core area in which a group of integrated circuits is formed; arranging cells constituting the low-order hierarchical functional blocks in the decided hierarchical-layout areas; arranging cells constituting the reconstituted high-order hierarchical functional block in the whole core area; and executing wiring including the signal connection between the formed high-order hierarchical functional block and arranged low-order hierarchical functional blocks and wiring between cells every lower-order hierarchical functional block.

According to the above aspect of the present invention, a net list of a semiconductor integrated-circuit device to be fabricated is reconstituted into a high-order hierarchical functional block and a plurality of low-order hierarchical functional blocks and hierarchical-layout areas of the reconstituted low-order hierarchical functional blocks are decided with no gap in the whole core area in which a group of integrated circuits is formed. Then, cells constituting the reconstituted low-order hierarchical functional blocks are arranged in the decided hierarchical-layout areas. Moreover, cells constituting the reconstituted high-order hierarchical functional block are arranged in the whole core area. That is, the cells constituting the high-order hierarchical functional block are arranged in the hierarchical-layout areas by distributing the cells. Then, wiring including the signal connection between the arranged high-order hierarchical functional block and low-order hierarchical functional blocks and inter-cell wiring every low-order hierarchical functional block are executed.

The computer program according to another aspect of the present invention stores instructions which when executed realizes the method according to the present invention on a computer.

Other objects and features of this invention will become apparent from the following description with reference to the accompanying drawings.

BRIEF DESCRIPTION OF THE DRAWINGS

FIG. 1 is a pattern diagram for explaining a method of designing a hierarchical-layout of a semiconductor integrated-circuit device according to a first embodiment of the present invention;

FIG. 2 is a flowchart of the method of designing the hierarchical-layout according to the first embodiment;

DESCRIPTION OF THE PREFERRED EMBODIMENTS

Embodiments of the method of designing the hierarchical-layout of the semiconductor integrated-circuit device, and a computer program for making a computer execute the method according to the present invention are described below in detail below while referring to the accompanying drawings.

FIG. 1 explains the method of designing the hierarchical-layout of the semiconductor integrated-circuit device, according to the first embodiment of the present invention. As shown in FIG. 1, a semiconductor integrated-circuit device 1 is provided with a core area 11 in which a group of integrated circuits is formed, and a buffer area 12 in which a group of peripheral circuits is formed.

Figure 5:
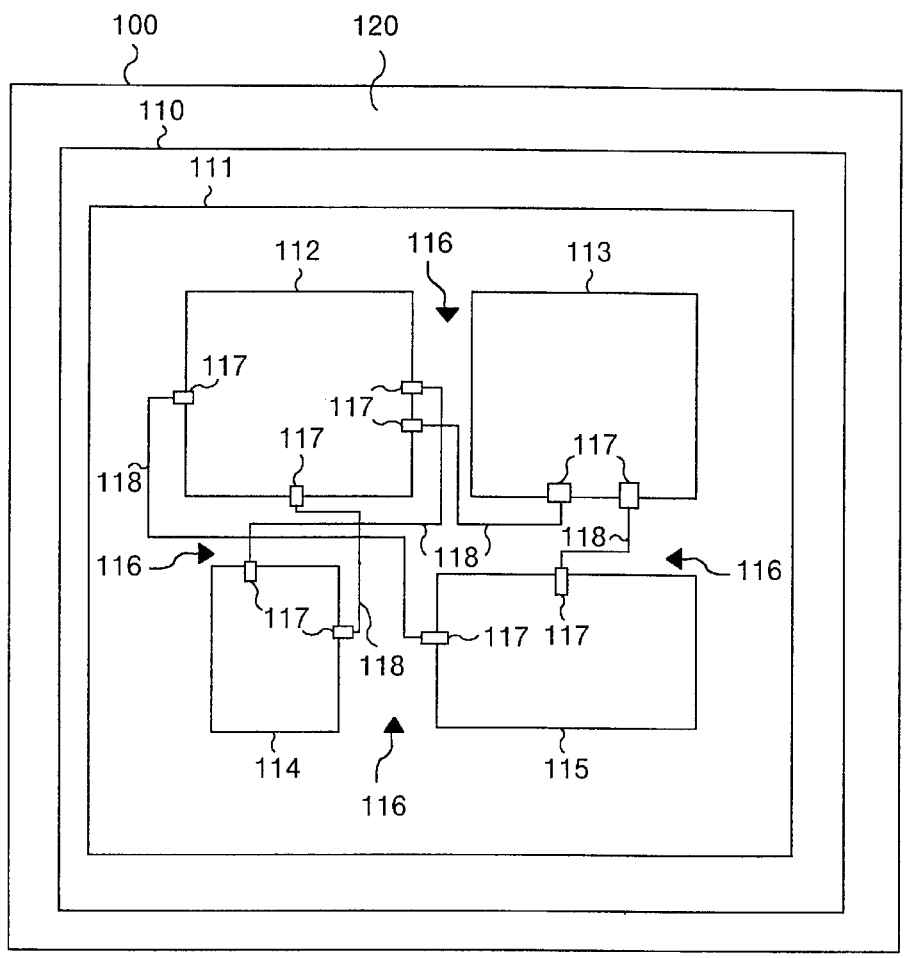
FIG. 5 is a pattern diagram for explaining a conventional method of designing the hierarchical-layout.

A high-order hierarchical functional block 21 is formed in the core area 11 and a plurality of low-order hierarchical functional blocks 31, 32, 33, and 34 are arranged in the formation area of the high-order hierarchical functional block 21 at small intervals, that is, without forming the conventional inter-block wiring area (refer to FIG. 5).

Cells 41 are arranged and connected each other in the low-order hierarchical functional blocks 31, 32, 33, and 34. Input/output terminals 41a used for connection between cells are set as signal connection terminals of the low-order hierarchical functional blocks. That is, signal connection terminals for low-order hierarchical functional blocks are defined not around the low-order hierarchical functional blocks, but in areas of the low-order hierarchical functional blocks.

Low-order hierarchical functional blocks are connected each other by connecting the input/output terminals 41a serving as the signal connection terminals defined as described above each other by a signal connection wiring 51. The signal connection wiring 51 is constituted of a wiring layer passing through the high-order hierarchical functional block 21 and a via. The wiring layer and the via constituting the signal connection wiring 51 is different from the wiring layer and via used for connection between cells in low-order hierarchical functional blocks.

Moreover, the high-order hierarchical functional block 21 is connected with low-order functional blocks by the wiring layer and via same as those used for the signal connection wiring 51. Though not illustrated, cells constituting the high-order hierarchical functional block 21 is set in gaps between low-order functional blocks.

The steps involved in the method of designing the hierarchical-layout of the first embodiment will be described below by referring to the circuit diagram shown in FIG. 1 and the flowchart shown in FIG. 2.

In step S1, it is decided that the wiring layer and via used for wiring layouts in low-order hierarchical functional blocks are different from those used for wiring layouts between low-order hierarchical functional blocks and between a high-order hierarchical functional block and low-order hierarchical functional blocks.

In step S2, the formation area of the high-order hierarchical functional block 21 is decided in the core area 11 in which a group of integrated circuits is formed. In step S3, arrangement areas of the low-order hierarchical functional blocks 31 to 34 are decided in the formation area of the decided high-order hierarchical functional block 21 by decreasing intervals between the arrangement areas.

In step S4, cells 41 constituting the low-order hierarchical functional blocks 31 to 34 are arranged in the arrangement areas of the blocks 31 to 34. In step S5, cells constituting the high-order hierarchical functional block 21 are arranged in gaps between the low-order hierarchical functional blocks.

In step S6, signal connection terminals for connecting the low-order hierarchical functional blocks 31 to 34 each other are set to input/output terminals 41a of the arranged cells in the arrangement areas of the blocks 31 to 34. In step S7, cells constituting the low-order hierarchical functional blocks 31 to 34 are connected each other by a via-included wiring layer different from the via-included wiring layer constituting the signal connection wiring 51 in the arrangement areas of the low-order hierarchical functional blocks 31 to 34.

In step S8, low-order hierarchical functional blocks are connected each other by connecting the signal connection wiring 51 constituted of a via-included wiring layer different from the wiring layer and via connecting cells each other to input/output terminals 41a of the cells 41 to which signal connection terminals are set through the high-order hierarchical functional block 21. In step S9, the high-order hierarchical functional block 21 is connected with low-order hierarchical functional blocks by the wiring layer and via same as those used for the signal connection wiring 51.

Thus, in the first embodiment, signal connection terminals of low-order hierarchical functional blocks are set in areas of the low-order hierarchical functional blocks so as to connect a wiring layer and a via for connecting signals between low-order hierarchical functional blocks with a wiring layer and a via for connecting signals between high- and low-order hierarchical functional blocks by a wiring layer other than the wiring layer in the low-order hierarchical functional blocks and a via.

As a result, because it is not necessary to form signal connection terminals around the low-order hierarchical functional blocks, it is possible to design a layout or chip without forming the wiring area between low-order hierarchical functional blocks in the core area and improve the integration degree without increasing the core area in size. In other words, it is possible to decrease the chip size.

Moreover, because a wiring layer other than the signal-processing wiring layer in low-order hierarchical functional blocks and a via are used, it is possible to execute a layout of every low-order hierarchical functional block. That is, because parallel processing of a layout can be performed, it is possible to decrease the time for chip design.

Figure 3:
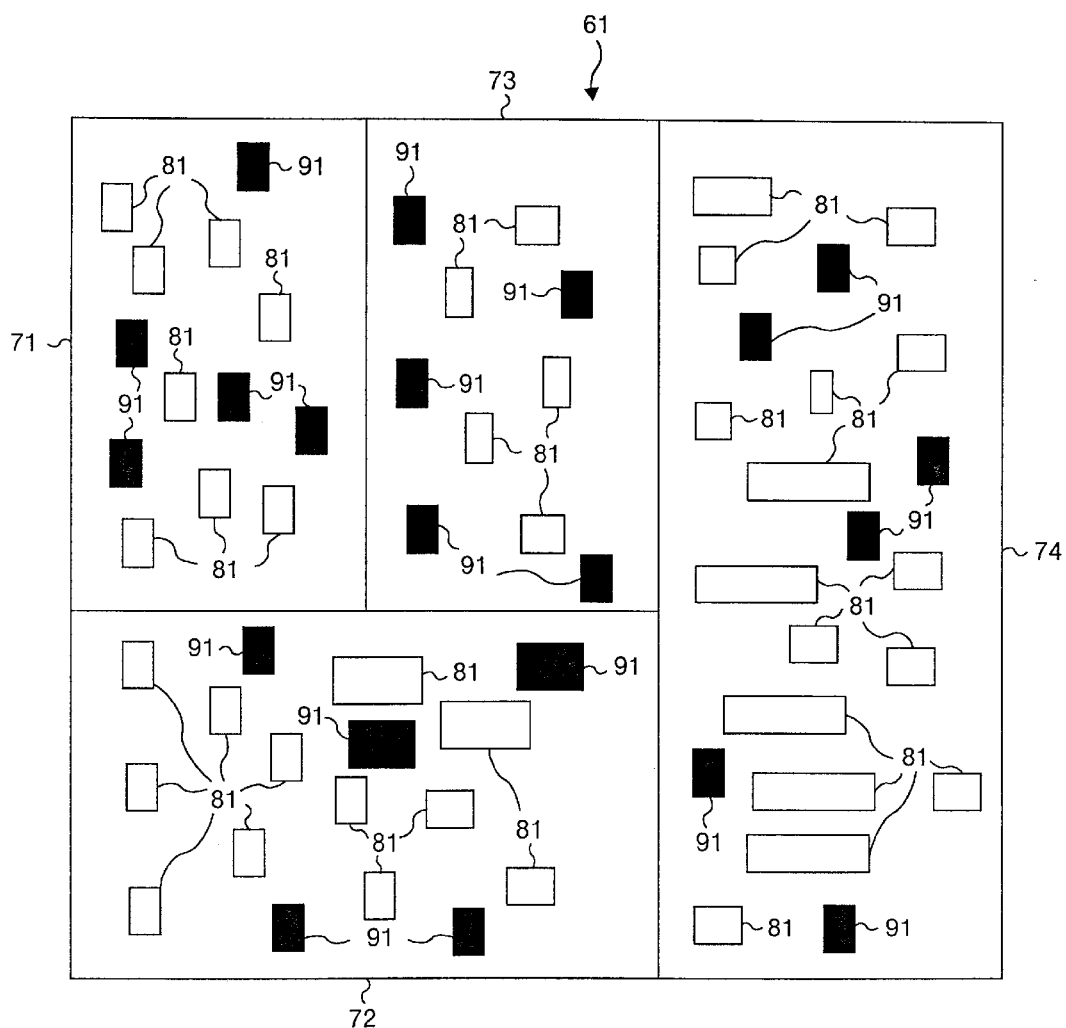
FIG. 3 is a pattern digram for explaining the method of designing the hierarchical-layout according to a second embodiment of the present invention.

FIG. 3 explains the method of designing the hierarchical-layout of the semiconductor integrated-circuit device, according to the second embodiment of the present invention. As shown in FIG. 3, only a core area is extracted from the core area and a buffer area constituting the semiconductor integrated-circuit device and shown.

As shown in FIG. 3, a plurality of low-order hierarchical functional blocks 71, 72, 73, and 74 are arranged with no gap in the whole core area 61 in which a group of integrated circuits is formed. Cells 81 constituting the low-order hierarchical functional blocks 71, 72, 73, and 74 are arranged in the blocks 71, 72, 73, and 74 and cells 91 constituting a high-order hierarchical functional block are dispersedly arranged. That is, the cells 91 constituting the high-order hierarchical functional block are arranged in the whole core area 61.

Thus, in the second embodiment, cells of the high-order hierarchical functional block are dispersedly arranged in low-order hierarchical functional block areas so as to perform signal connection. In this case, arrangement areas of the low-order hierarchical functional blocks 71, 72, 73, and 74 constitute a hierarchical-layout area.

Figure 4:
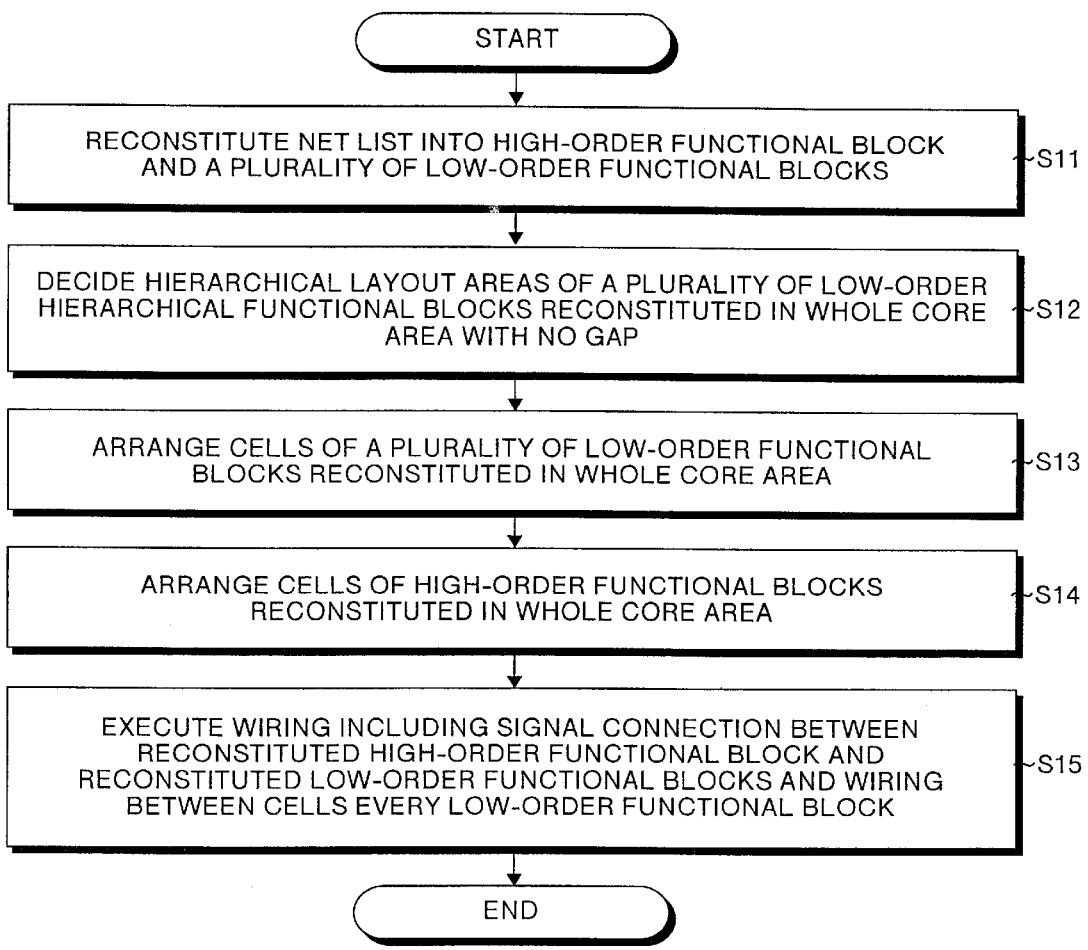
FIG. 4 is a flowchart of the method of designing the hierarchical-layout according to the second embodiment.

The steps involved in the method of designing the hierarchical-layout of the second embodiment will be described below by referring to the circuit diagram shown in FIG. 3 and the flowchart shown in FIG. 4.

In step S11, functional blocks may be further added below low-order hierarchical functional blocks in case of the net list of a semiconductor integrated-circuit device to be fabricated. Therefore, the above functional blocks are arranged and reconstituted into a high-order hierarchical functional block and a plurality of low-order hierarchical functional blocks.

In step S12, hierarchical-layout areas of the low-order hierarchical functional blocks 71 to 74 reconstituted with no gap in the whole core area 61 in which a group of integrated circuits is formed as described above are decided.

In step S13, the cells 81 constituting the reconstituted low-order hierarchical functional blocks 71 to 74 are arranged in the hierarchical-layout areas decided as described above.

In step S14, the cells 91 constituting the high-order hierarchical functional block reconstituted as described above are arranged in the whole core area 61. That is, as shown in FIG. 3, the cells 91 constituting the high-order hierarchical block are dispersedly arranged in the areas of the low-order hierarchical functional blocks 71 to 74.

In step S15, wiring including the signal connection between the high-order hierarchical functional block and low-order hierarchical functional blocks arranged as described above, and wiring between cells in every low-order hierarchical functional block are executed. For the signal connection between high-order and low-order hierarchical functional blocks, it is optional to connect wirings in the sequence from the high-order hierarchical functional block to the low-order hierarchical functional blocks and vice versa.

Thus, in the second embodiment, the layout for dividing the whole core area 61 into the low-order hierarchical functional blocks 71 to 74 is performed and then, the cells 91 of the high-order hierarchical functional block are dispersedly arranged in the whole core area 61.

As a result, it is possible to execute chip layout without obtaining the area of the high-order hierarchical functional block separately from obtainment of areas of the low-order hierarchical functional blocks and layout the low-order hierarchical functional blocks in parallel. Therefore, the design time can be reduced.

Moreover, it is possible to perform chip layout without forming a wiring area between the low-order hierarchical functional blocks in the core area or without forming the gaps as described for the first embodiment. Therefore, it is possible to effectively use chip area and optimize chip size.

The various steps involved in the method of designing the hierarchical-layout according to this invention may be realized on a computer by writing a computer program and executing this computer program on the computer. The computer program may be stored on a computer readable recording medium such as floppy disk, CD ROMs, or computer hard disks, and the computer is made to read the computer program from these recording medium. Alternately, the computer program may be made available over the Internet for download.

As described above, according to one aspect of the present invention, the formation area of a high-order hierarchical functional block is decided in a core area in which a group of integrated circuits is formed and arrangement areas of a plurality of low-order hierarchical functional blocks are decided in the decided formation area of the high-order hierarchical functional block by decreasing intervals between the arrangement areas. Then, signal connection terminals for connecting between the plurality of decided low-order hierarchical functional block are set in the area of the low-order hierarchical functional block. Then, cells are connected each other by a first wiring layer including a first via in the arrangement areas of the low-order hierarchical functional blocks. Moreover, the low-order hierarchical functional blocks are connected each other by a second wiring layer including a second via through the high-order hierarchical functional block and the high-order hierarchical functional block is connected with the low-order hierarchical functional blocks by a second wiring layer including the second via. Therefore, advantages are obtained that it is possible to perform chip layout without forming an inter-block wiring area in the core area and decrease a chip size. Moreover, because a wiring layer other than the signal-processing wiring layer in the low-order hierarchical functional blocks and a via are used for signal connection between the low-order hierarchical functional blocks, it is possible to execute a layout every low-order hierarchical functional block and decrease chip design time.

According to another aspect of the present invention, a net list of a semiconductor integrated-circuit device to be fabricated is reconstituted into a high-order hierarchical functional block and a plurality of low-order hierarchical functional blocks to decide hierarchical-layout areas of the reconstituted low-order hierarchical functional blocks with no gap in the whole core area. Then, cells constituting the reconstituted low-order hierarchical functional blocks are arranged in the decided hierarchical-layout areas. Moreover, cells constituting the reconstituted high-order hierarchical functional block are arranged in the whole core area. Then, the wiring including signal connection between the arranged high- and low-order hierarchical functional blocks and the wiring between cells every low-order hierarchical functional block are executed. Therefore, it is possible to perform a chip layout and reduce a chip size without forming an inter-block wiring area in the core area. Moreover, it is possible to execute a chip layout without obtaining the area of the high-order hierarchical functional block separately from obtainment of areas of the low-order hierarchical functional blocks and execute the layout of the low-order hierarchical functional blocks in parallel. Therefore, design time can be reduced. Furthermore, because a chip layout using the whole core area can be performed, it is possible to effectively use a chip area and optimize a chip size.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of designing a hierarchical-layout of a semiconductor integrated circuit device, the method comprising:

determining an arrangement area where a high-order hierarchical functional block is to be arranged in a core area, the core area being an area in which a group of integrated circuits is located;

determining arrangement areas where a plurality of low-order hierarchical functional blocks are to be arranged in the arrangement area of the high-order hierarchical functional block so that distances between the low-order hierarchical functional blocks is minimized;

arranging cells constituting the low-order hierarchical functional blocks in each of the low-order hierarchical functional blocks;

establishing signal connection terminals for connecting input/output terminals of the arranged cells to a corresponding low-order functional block;

connecting the cells constituting the low-order hierarchical function blocks to each other by a first wiring layer including a first via in each of the arrangement areas of the low-order hierarchical functional blocks;

connecting the low-order hierarchical functional blocks to each other by connecting a second wiring layer including a second via, different from the first wiring layer including the first via, to input/output terminals of the cells for which the signal connection terminals are established via the high-order hierarchical functional block; and connecting the high-order hierarchical functional block with the low-order hierarchical functional blocks using the second wiring layer including the second via which connects the low-order hierarchical functional blocks to each other.

2. A method of designing a hierarchical-layout of a semiconductor integrated circuit device, the method comprising:

reconstituting a net list of a semiconductor integrated circuit device to be fabricated into a high-order hierarchical functional block and a plurality of low-order hierarchical functional blocks;

determining hierarchical-layout areas of the reconstituted low-order hierarchical functional blocks without a gap in a whole core area in which a group of integrated circuits is located;

arranging cells constituting the low-order hierarchical functional blocks in the hierarchical-layout areas determined;

arranging cells constituting the reconstituted high-order hierarchical functional block in the whole core area; and executing wiring including signal connections between the high-order hierarchical functional block and low-order hierarchical functional blocks and wiring between the cells constituting each lower-order hierarchical functional block.

3. A computer program containing instructions which, when executed on a computer, causes the computer to:

determine an arrangement area where a high-order hierarchical functional block is to be arranged in a core area, the core area being an area in which a group of integrated circuits is located;

determine arrangement areas where a plurality of low-order hierarchical functional blocks are to be arranged in the arrangement area of the high-order hierarchical functional block so that distances between the low-order hierarchical functional blocks is minimized;

arrange cells constituting the low-order hierarchical functional blocks in each of the low-order hierarchical functional blocks;

establish signal connection terminals for connecting input/output terminals of the arranged cells to a corresponding low-order functional block;

connect the cells constituting the low-order hierarchical function blocks to each other by a first wiring layer including a first via in each of the arrangement areas of the low-order hierarchical functional blocks;

connect the low-order hierarchical functional blocks to each other by connecting a second wiring layer including a second via, different from the first wiring layer including the first via, to input/output terminals of the cells for which the signal connection terminals are established via the high-order hierarchical functional block; and connecting the high-order hierarchical functional block with the low-order hierarchical functional blocks using the second wiring layer including the second via which connects the low-order hierarchical functional blocks to each other.

4. A computer program containing instructions which, when executed on a computer, causes the computer to:

reconstitute a net list of a semiconductor integrated circuit device to be fabricated into a high-order hierarchical functional block and a plurality of low-order hierarchical functional blocks;

determine hierarchical-layout areas of the reconstituted low-order hierarchical functional blocks without a gap in a whole core area in which a group of integrated circuits is located;

arrange cells constituting the low-order hierarchical functional blocks in the hierarchical-layout areas determined;

arrange cells constituting the reconstituted high-order hierarchical functional block in the whole core area; and execute wiring including signal connections between the high-order hierarchical functional block and the low-order hierarchical functional blocks and wiring between the cells constituting each lower-order hierarchical functional block.

* * * * *